(12) United States Patent
Yosui

(10) Patent No.: US 10,568,209 B2
(45) Date of Patent: Feb. 18, 2020

(54) RESIN SUBSTRATE, COMPONENT-MOUNTED RESIN SUBSTRATE, AND METHOD OF MANUFACTURING COMPONENT-MOUNTED RESIN SUBSTRATE

(71) Applicant: Murata Manufacturing Co., Ltd., Nagaokakyo-shi, Kyoto-fu (JP)

(72) Inventor: Kuniaki Yosui, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/791,449

(22) Filed: Oct. 24, 2017

(65) Prior Publication Data

US 2018/0049325 A1 Feb. 15, 2018

Related U.S. Application Data

(63) Continuation of application No. PCT/JP2016/068072, filed on Jun. 17, 2016.

(30) Foreign Application Priority Data

Jul. 13, 2015 (JP) .................. 2015-139734

(51) Int. Cl.
*H05K 1/18* (2006.01)
*H05K 1/11* (2006.01)
(Continued)

(52) U.S. Cl.
CPC ........... *H05K 1/185* (2013.01); *H05K 1/0313* (2013.01); *H05K 1/111* (2013.01); *H05K 1/115* (2013.01);
(Continued)

(58) Field of Classification Search
CPC .... H05K 1/183; H05K 3/4617; H05K 3/4697; H05K 3/303; H05K 2201/0195;
(Continued)

(56) References Cited

U.S. PATENT DOCUMENTS 5,684,677 A * 11/1997 Uchida .................. H05K 3/303
361/770
8,942,003 B2 * 1/2015 Sahara ................... H05K 1/183
361/761

(Continued)

FOREIGN PATENT DOCUMENTS

JP 2007-173616 A 7/2007
JP 2007-173724 A 7/2007
(Continued)

OTHER PUBLICATIONS

Original Somada (JP2013020993A) provided with Office Action.*
(Continued)

*Primary Examiner* — Roshn K Varghese
(74) *Attorney, Agent, or Firm* — Keating & Bennett, LLP

(57) ABSTRACT

A resin substrate includes a base portion including one first resin sheet made of a thermoplastic resin as a main material or a stack of two or more first resin sheets each made of a thermoplastic resin as a main material, the base portion including a main surface, and first and second connecting conductors provided on the main surface of the base portion and spaced away from each other. The base portion includes a convex portion separating the first and second connecting conductors on the main surface by a second resin sheet disposed at a position on a surface of the base portion or inside the base portion. The second resin sheet is made of the same material as the first resin sheet.

17 Claims, 14 Drawing Sheets

(51) Int. Cl.
*H05K 3/34* (2006.01)
*H05K 1/03* (2006.01)
*H05K 3/00* (2006.01)
*H05K 3/40* (2006.01)
*H05K 3/46* (2006.01)

(52) U.S. Cl.
CPC ............. *H05K 3/0014* (2013.01); *H05K 3/34* (2013.01); *H05K 3/4007* (2013.01); *H05K 3/4038* (2013.01); *H05K 3/4697* (2013.01); *H05K 2201/0129* (2013.01); *H05K 2201/0195* (2013.01); *H05K 2201/09045* (2013.01); *H05K 2201/10636* (2013.01)

(58) Field of Classification Search
CPC . H05K 2201/09045; H05K 2201/0191; H05K 1/115; H05K 1/116; H05K 3/3452; H05K 3/3457; H05K 3/28; H01L 23/48838; H01L 21/563; H01L 21/447; H01L 21/449; H01L 23/12; H01L 23/13; H01L 23/14; H01L 23/49838
USPC .................................................. 361/763, 770
See application file for complete search history.

(56) References Cited

U.S. PATENT DOCUMENTS

| | | | | |
|---|---|---|---|---|
| 9,078,358 | B2* | 7/2015 | Toratani | H05K 1/0263 |
| 2002/0047749 | A1* | 4/2002 | Sugawara | H01L 24/83 |
| | | | | 257/E21.514 |
| 2005/0253231 | A1* | 11/2005 | Liu | H01L 23/3121 |
| | | | | 257/678 |
| 2006/0283627 | A1* | 12/2006 | Chen | H05K 1/183 |
| | | | | 174/260 |
| 2007/0175969 | A1* | 8/2007 | Wada | H05K 3/305 |
| | | | | 228/180.1 |
| 2008/0136013 | A1* | 6/2008 | Kamiya | H05K 1/186 |
| | | | | 29/830 |
| 2010/0089628 | A1 | 4/2010 | Wada et al. | |
| 2012/0181074 | A1* | 7/2012 | Ishihara | H05K 3/4691 |
| | | | | 174/261 |

FOREIGN PATENT DOCUMENTS

| | | | | |
|---|---|---|---|---|
| JP | 2010-98021 | A | | 4/2010 |
| JP | 2011-243870 | A | | 12/2011 |
| JP | 2011243870 | A | * | 12/2011 |
| JP | 2013020993 | A | * | 1/2013 |
| WO | 2013/129154 | A1 | | 9/2013 |

OTHER PUBLICATIONS

Machine Translation of Somada (JP2013020993A) provided with Office Action.*
English Machine Translation of Nomura (JP2011-243870 A) provided with Office Action (Year: 2011).*
Official Communication issued in International Patent Application No. PCT/JP2016/068072, dated Aug. 16, 2016.
Official Communication issued in corresponding Japanese Patent Application No. 2017-528342, dated Nov. 7, 2018.

* cited by examiner

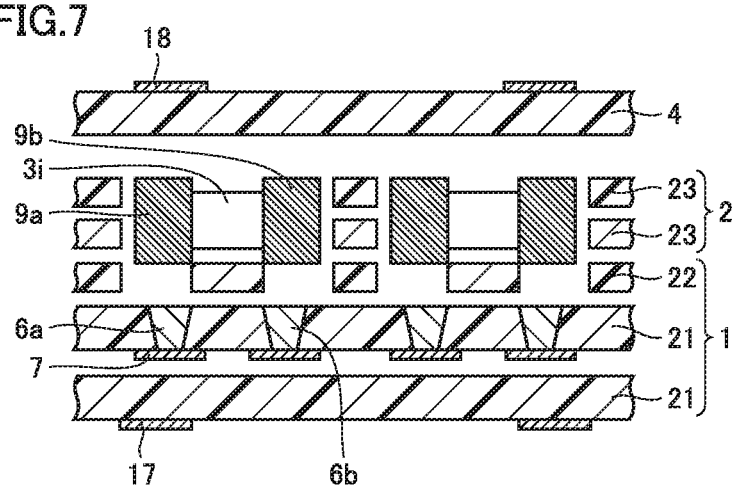
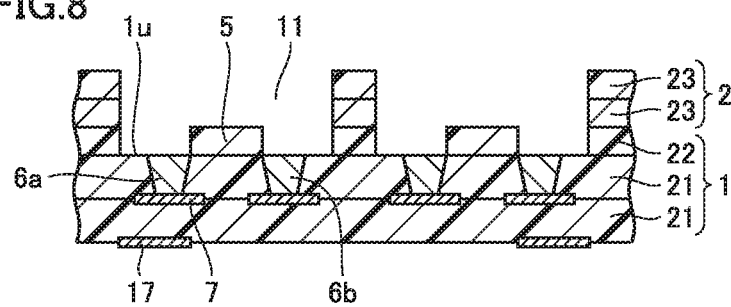

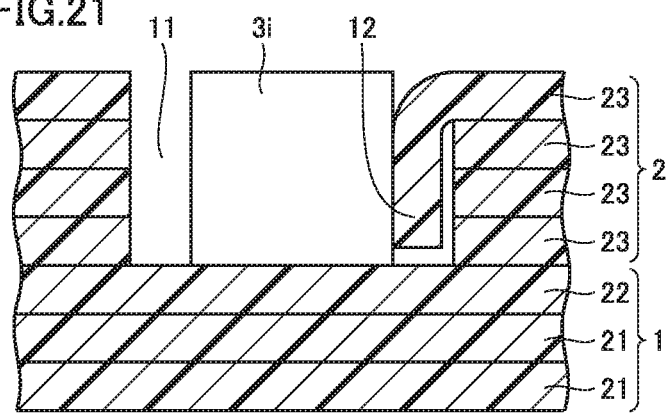
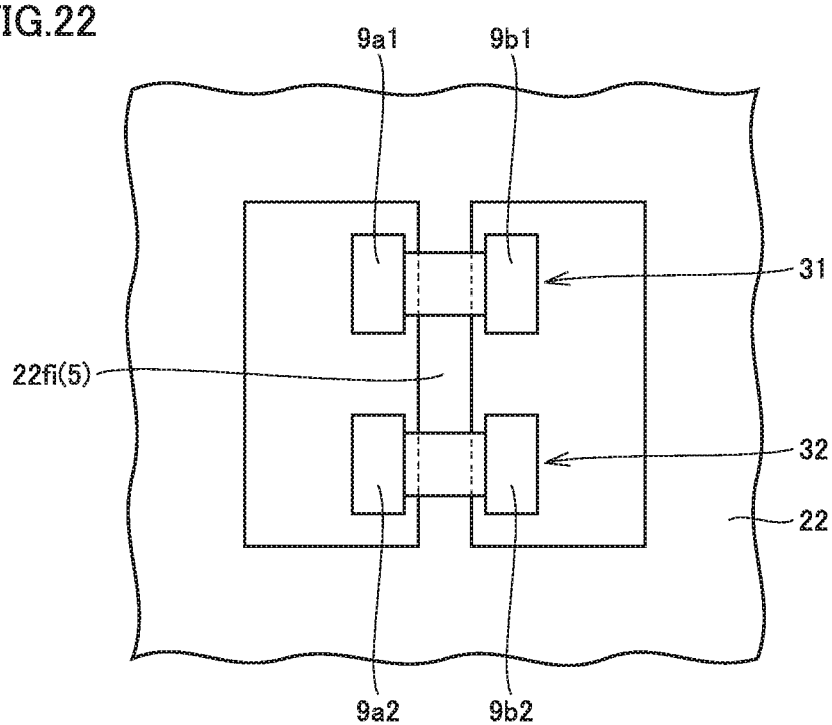

RESIN SUBSTRATE, COMPONENT-MOUNTED RESIN SUBSTRATE, AND METHOD OF MANUFACTURING COMPONENT-MOUNTED RESIN SUBSTRATE

CROSS REFERENCE TO RELATED APPLICATIONS

This application claims the benefit of priority to Japanese Patent Application No. 2015-139734 filed on Jul. 13, 2015 and is a Continuation Application of PCT Application No. PCT/JP2016/068072 filed on Jun. 17, 2016. The entire contents of each application are hereby incorporated herein by reference.

BACKGROUND OF THE INVENTION

1. Field of the Invention

The present invention relates to a resin substrate, a component-mounted resin substrate, and a method of manufacturing the component-mounted resin substrate.

2. Description of the Related Art

Japanese Patent Laid-Open No. 2010-98021 discloses a component-embedded wiring substrate including a core layer including a chip component mounted thereon, in which a resist is formed at a position between a pair of electrodes on the chip component so as to block the flow of molten solder.

In Japanese Patent Laid-Open No. 2010-98021, a resist is formed on the upper surface of an insulating resin substrate for the purpose of blocking the flow of molten solder. However, the resin forming the resin substrate and the resist are made of different materials, and therefore, have different physical properties. Due to such differences, the substrate and the resist have different behaviors, with the result that the resist is more likely to peel off.

SUMMARY OF THE INVENTION

Preferred embodiments of the present invention provide resin substrates that are resistant to peeling while preventing the flow of a joining material, component-mounted resin substrates, and methods of manufacturing the component-mounted resin substrates.

A resin substrate according to a preferred embodiment of the present invention includes a base portion including one first resin sheet made of a thermoplastic resin as a main material or a stack of two or more first resin sheets each made of a thermoplastic resin as a main material, the base portion including a main surface; and a first connecting conductor and a second connecting conductor that are provided on the main surface of the base portion so as to be spaced away from each other. The base portion includes a convex portion separating the first connecting conductor and the second connecting conductor from each other on the main surface by a second resin sheet disposed at a position on a surface of the base portion or inside the base portion. A material of the second resin sheet is preferably the same as a material of the first resin sheet. The convex portion preferably includes a bridge portion and a frame-shaped portion that supports the bridge portion.

According to various preferred embodiments of the present invention, resin substrates that are resistant to peeling while preventing the flow of a joining material are provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7 is an exploded view of a component-mounted resin substrate in a fourth preferred embodiment according to the present invention.

FIG. 8 is a cross-sectional view showing the state at a halfway point of assembly of the component-mounted resin substrate in the fourth preferred embodiment according to the present invention.

FIG. 21 is a cross-sectional view showing the state where a component is inserted in the outer peripheral portion included in the component-mounted resin substrate in the eighth preferred embodiment according to the present invention.

FIG. 22 is a plan view showing the positional relationship between a second resin sheet and a component included in a component-mounted resin substrate in a ninth preferred embodiment according to the present invention.

DETAILED DESCRIPTION OF THE PREFERRED EMBODIMENTS

The dimension ratios shown in each of the figures do not always faithfully show the actual dimension ratios, and may show the dimension ratios in an exaggerated manner for the sake of explanation.

In the following description, the concept of "upper" or "lower" does not indicate an absolute upper or lower position, but indicates a relatively upper or lower position in the posture shown in each figure.

First Preferred Embodiment

Figure 1:
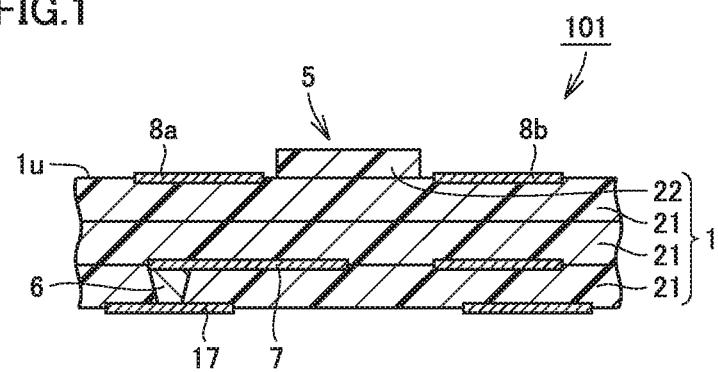
FIG. 1 is a cross-sectional view of a resin substrate in each of first and second preferred embodiments according to the present invention.

Referring to FIG. 1, a resin substrate in a first preferred embodiment according to the present invention will be hereinafter described.

As shown in FIG. 1, a resin substrate 101 includes a base portion 1 including a main surface 1u and a stack of two or more (for example, three in the present preferred embodiment) first resin sheets 21 each made of a thermoplastic resin as a main material; and an electrode 8a as the first connecting conductor and an electrode 8b as the second connecting conductor that are provided on main surface 1u of base portion 1 so as to be spaced away from each other. Base portion 1 includes a convex portion 5. Convex portion 5 is structured and functions to separate electrode 8a and electrode 8b from each other on main surface 1u by a second resin sheet 22 disposed on the surface of base portion 1. Second resin sheet 22 is made of the same material as first resin sheet 21. In the present preferred embodiment, first resin sheet 21 and second resin sheet 22 each are preferably made of a liquid crystal polymer or other suitable resin, for example. Second resin sheet 22 is disposed so as to entirely or substantially entirely cross the region sandwiched between a formation region of electrode 8a and a formation region of electrode 8b when seen in a plan view.

Second resin sheet 22 is preferably thinner than first resin sheet 21. Base portion 1 may preferably include a conductor pattern 7 therein. Conductor pattern 7 is disposed at the interface between first resin sheets 21, for example, as shown in FIG. 1. Base portion 1 may include a lower surface provided with an external electrode 17. External electrode 17 and conductor pattern 7 that is provided inside are preferably connected through a conductor via 6, for example. Conductor via 6 penetrates through one resin sheet included in base portion 1 in the thickness direction.

In the above description, three first resin sheets 21 and one second resin sheet 22 are stacked in base portion 1, which is however merely by way of example, and the number of sheets is not limited to thereto. The number of first resin sheets 21 included in base portion 1 may be other than three. The number of first resin sheets 21 included in base portion 1 may be only one, for example. The number of second resin sheets 22 included in base portion 1 may be two or more, for example.

Figure 2:
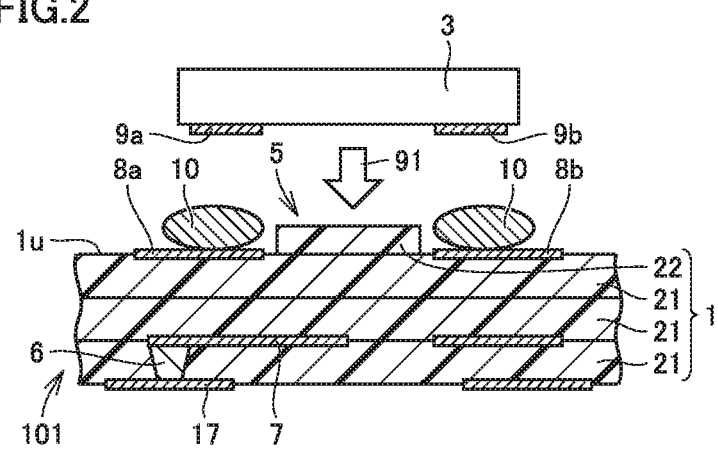
FIG. 2 is an explanatory diagram showing the manner in which a component is connected to the resin substrate in each of the first and second preferred embodiments according to the present invention.

In resin substrate 101, as shown in FIG. 2, a joining material 10 is disposed on the upper surface of each of electrodes 8a and 8b, so that a component 3 is able to be connected through joining material 10. Component 3 includes a lower surface on which a first external electrode 9a and a second external electrode 9b are provided. Joining material 10 has conductivity. Joining material 10 is preferably solder, for example. In the present preferred embodiment, component 3 is disposed such that a portion of its lower surface contacts second resin sheet 22, which is however merely by way of example, and the lower surface of component 3 does not need to contact second resin sheet 22.

In resin substrate 101 in the present preferred embodiment, base portion 1 includes convex portion 5 that provides separation between electrode 8a as the first connecting conductor and electrode 8b as the second connecting conductor that are provided on main surface 1u of base portion 1. Accordingly, when electrodes 8a and 8b are used to establish electrical connection to component 3, convex portion 5 blocks the flow of joining material 10. Furthermore, since convex portion 5 is defined by first resin sheet 21 or second resin sheet 22 that is made of the same material as first resin sheet 21, convex portion 5 does not have different physical properties from portions other than convex portion 5 in base portion 1. Thus, second resin sheet 22 is less likely to peel off.

Therefore, according to the present preferred embodiment, a resin substrate that is resistant to peeling while preventing the flow of a joining material is provided.

In the description of the present preferred embodiment, second resin sheet 22 is preferably thinner than first resin sheet 21, which is however merely by way of example, but second resin sheet 22 may have the same thickness as that of first resin sheet 21. In contrast, second resin sheet 22 may be thicker than first resin sheet 21.

In addition, the number of first resin sheets 21 included in base portion 1 is not limited to two or more, but may be only one, for example. In the description of the present preferred embodiment, second resin sheet 22 is disposed on the surface of base portion 1, but may be disposed inside base portion 1.

Second Preferred Embodiment

Figure 3:
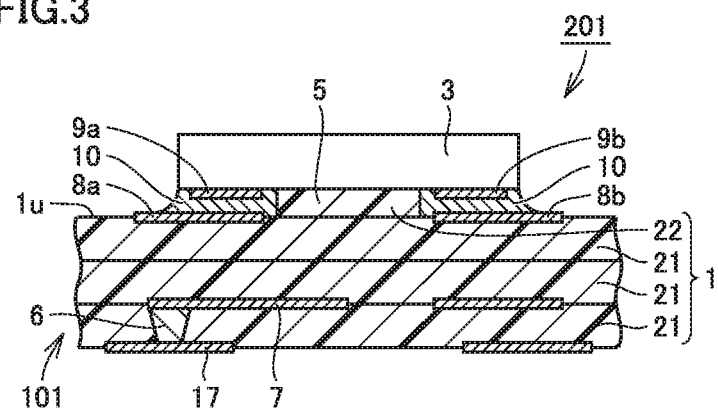
FIG. 3 is a cross-sectional view of a component-mounted resin substrate in the second preferred embodiment according to the present invention.

Referring to FIGS. 1 to 3, a component-mounted resin substrate in a second preferred embodiment according to the present invention will be hereinafter described. Using joining material 10 as shown in FIG. 2, component 3 is connected to resin substrate 101 shown in FIG. 1 in the first preferred embodiment. Component 3 is connected to resin substrate 101 as shown by an arrow 91. In this manner, a component-mounted resin substrate 201 as shown in FIG. 3 is obtained.

Component-mounted resin substrate 201 in the present preferred embodiment includes a resin substrate 101 described in the first preferred embodiment; and a component 3 including a first external electrode 9a and a second external electrode 9b. Component 3 is disposed on the upper surface of base portion 1 so as to extend over convex portion 5. Electrode 8a as the first connecting conductor and electrode 8b as the second connecting conductor are electrically connected to first external electrode 9a and second external electrode 9b, respectively.

In component-mounted resin substrate 201 in the present preferred embodiment, base portion 1 as a portion of resin substrate 101 includes convex portion 5. Convex portion 5 provides separation between electrode 8a as the first connecting conductor and electrode 8b as the second connecting conductor that are provided on main surface 1u of base portion 1. Also, component 3 is disposed so as to extend over convex portion 5. Thus, electrodes 8a and 8b are electrically connected to first external electrode 9a and second external electrode 9b on component 3 in the state in which joining materials 10 located at two positions on the right and left sides are blocked by convex portion 5. The flow of joining material 10 is blocked by convex portion 5. For the reason described in the first preferred embodiment, second resin sheet 22 is also less likely to peel off.

Therefore, according to the present preferred embodiment, a component-mounted resin substrate that is resistant to peeling while preventing the flow of a joining material is provided.

Third Preferred Embodiment

Figure 4:
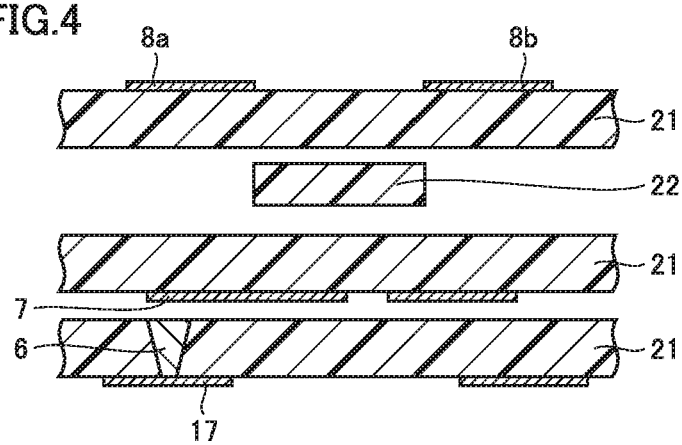
FIG. 4 is an exploded view of a resin substrate in a third preferred embodiment according to the present invention.
Figure 5:
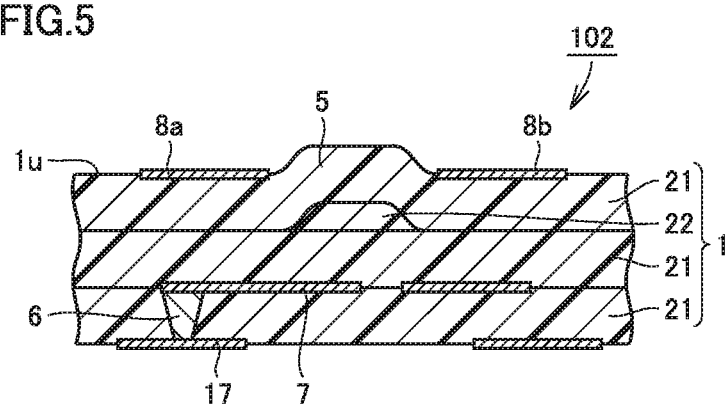
FIG. 5 is a cross-sectional view of the resin substrate in the third preferred embodiment according to the present invention.

Referring to FIGS. 4 to 5, a resin substrate in a third preferred embodiment according to the present invention will be hereinafter described. As shown in FIG. 4, two or more first resin sheets 21 and one second resin sheet 22 are combined and stacked, to which heat and pressure are applied, to thermocompression-bond the resin sheets, with the result that a substrate 102 shown in FIG. 5 is obtained. First resin sheet 21 and second resin sheet 22 are made of the same material. Second resin sheet 22 is not disposed on the uppermost layer of base portion 1 but is disposed immediately below first resin sheet 21 located as the uppermost layer, with the result that second resin sheet 22 is sandwiched between two first resin sheets 21. Through thermocompression-bonding, second resin sheet 22 and first resin sheets 21 disposed therearound are also deformed and hardened in a shape as shown in FIG. 5. Second resin sheet 22 is inserted below first resin sheet 21 located as the uppermost layer, to cause first resin sheet 21 to have a partially bulging portion, which results in a convex portion 5 on main surface 1u.

In the present preferred embodiment, as shown in FIG. 5, the end of second resin sheet 22 is covered by first resin sheet 21 on the main surface 1u side of base portion 1.

Figure 6:
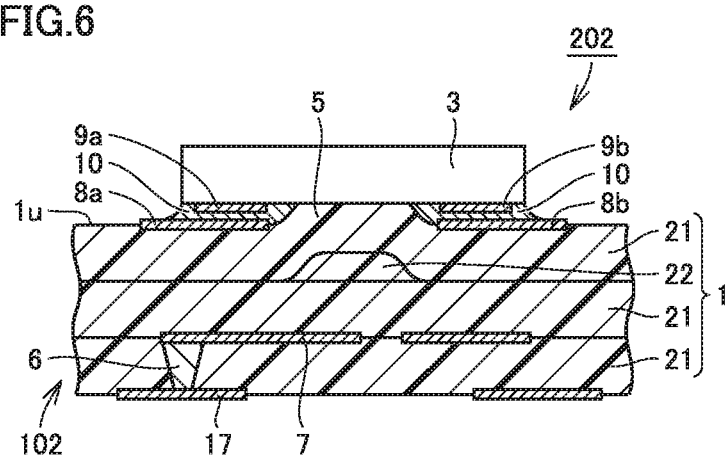
FIG. 6 is a cross-sectional view of a component-mounted resin substrate in the third preferred embodiment according to the present invention.

FIG. 6 shows a state in which component 3 is mounted on resin substrate 102 shown in FIG. 5. Component 3 is connected to base portion 1 through joining material 10. Joining materials 10 located at two positions on the right and left sides are blocked by convex portion 5. FIG. 6 shows a component-mounted resin substrate 202 in the present preferred embodiment.

In the present preferred embodiment, second resin sheet 22 is not located as an uppermost layer but is preferably disposed at a position sandwiched between first resin sheets 21. However, in such a configuration in which the end of second resin sheet 22 is covered by first resin sheet 21, peeling starting from the end of second resin sheet 22 is less likely to occur.

Therefore, according to the present preferred embodiment, a component-mounted resin substrate that is resistant to peeling while preventing the flow of a joining material is provided. In the present preferred embodiment, the position at which second resin sheet 22 is inserted is immediately below first resin sheet 21 located as the uppermost layer, but is not limited thereto. For example, second resin sheet 22 may be inserted between the n-th (n is an integer equal to or greater than 2) first resin sheet from the top and the (n+1)-th first resin sheet 21 from the top.

Second resin sheet 22 may be disposed below first resin sheet 21 located as the lowermost layer among a plurality of first resin sheets 21. In this case, second resin sheet 22 is exposed from the lower surface of the stacked body defining base portion 1. Also in this case, the end of second resin sheet 22 on the main surface 1u side of base portion 1 is covered by first resin sheet 21.

Practically, it is preferable that the position at which second resin sheet 22 is inserted is immediately below first resin sheet 21 located as the uppermost layer, as shown in FIGS. 4 and 5. This is because this position is more likely to cause first resin sheet 21 as an uppermost layer to be sufficiently deformed due to existence of second resin sheet 22.

Fourth Preferred Embodiment

Figure 9:
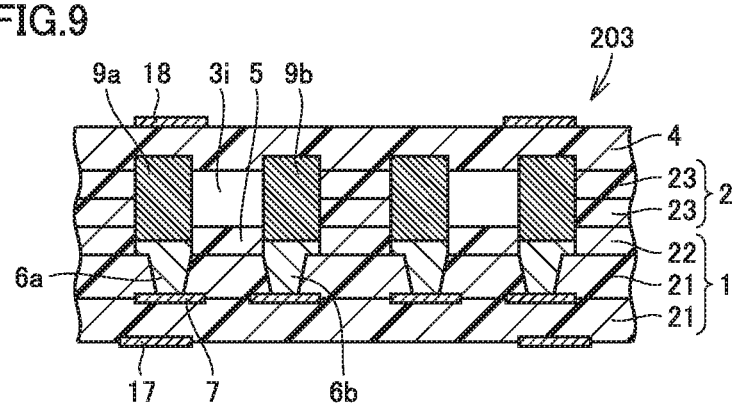
FIG. 9 is a cross-sectional view of the component-mounted resin substrate in the fourth preferred embodiment according to the present invention.

Referring to FIGS. 7 to 9, a component-mounted resin substrate in a fourth preferred embodiment according to the present invention will be hereinafter described. As shown in FIG. 7, a first resin sheet 21 and a second resin sheet 22 are combined and stacked to define a base portion 1. Base portion 1 includes a stack of a plurality of first resin sheets 21. An outer peripheral portion 2 is provided on the upper side of second resin sheet 22. Outer peripheral portion 2 shown in this case includes a plurality of third resin sheets 23. Outer peripheral portion 2 is provided as an outer peripheral portion of cavity 11 in which a component 3i is embedded (mounted). Component 3i includes both ends provided with a first external electrode 9a and a second external electrode 9b. When seen in a plan view, second resin sheet 22 is disposed to entirely or substantially entirely cross the region sandwiched between a lower surface formation region of first external electrode 9a and a lower surface formation region of second external electrode 9b.

It is to be noted that component 3i has a thickness and a width that are increased in regions of first external electrode 9a and second external electrode 9b, which is caused by a thickness of the applied external electrode material. In the present preferred embodiment, it is preferable that second resin sheet 22 has a thickness that is greater than the thickness corresponding to the protruding portions of first external electrode 9a and second external electrode 9b that extend downward from the main body of component 3i.

FIG. 8 shows a stack of some of the layers in the exploded view shown in FIG. 7. FIG. 8 shows the state in which these layers are stacked and temporarily pressure-bonded by way of example. In this manner, it is preferable that some of the layers are temporarily pressure-bonded after stacking of these layers because the shape of cavity 11 is stabilized. As shown in FIG. 8, a convex portion 5 is defined by second resin sheet 22 on main surface 1u of base portion 1. Cavity 11 is defined by base portion 1 and outer peripheral portion 2. FIG. 9 shows the state in which component 3i is further mounted on the product shown in FIG. 8, which is covered by a cover portion 4, and then heated and pressurized. In FIG. 9, thermocompression-bonding is completed, and the entirely integrated configuration is achieved. As such, component-mounted resin substrate 203 is obtained. Component-mounted resin substrate 203 includes an upper surface on which an external electrode 18 is provided.

As shown in FIG. 9, resin substrate 203 includes a base portion 1 including a main surface 1u (see FIG. 8) and a stack of two or more (two in the present preferred embodiment) first resin sheets 21 each made of a thermoplastic resin as a main material; and conductor vias 6a and 6b as the first and second connecting conductors that are provided on main surface 1u of base portion 1 so as to be spaced away from each other. Base portion 1 includes, on main surface 1u, a convex portion 5 separating conductor vias 6a and 6b from each other by second resin sheet 22 disposed on the surface of base portion 1. Second resin sheet 22 is made of the same material as first resin sheet 21.

In the present preferred embodiment, the first connecting conductor and the second connecting conductor correspond to conductor via 6a and conductor via 6b, respectively. In the present preferred embodiment, the materials that overflow from conductor vias 6a and 6b upon heating and pressurization define a joining material.

In the present preferred embodiment, the first and second connecting conductors are not provided as plate-shaped electrodes, but are provided as conductor vias 6a and 6b, in which conductor via 6a and first external electrode 9a are to be connected, and conductor via 6b and second external electrode 9b are to be connected. In such a case, in order to produce component-mounted resin substrate 203, resin sheets are first stacked, which are then collectively heated and pressurized. When heat and pressure are applied, the fluidized conductor overflows from each of conductor vias 6a and 6b toward an upper gap. In this case, the conductor overflowing from each of conductor vias 6a and 6b corresponds to a joining material. Also in the case where the material of the conductor via overflows in this manner, convex portion 5 is provided in the present preferred embodiment, so that an undesirable flow of the joining material is blocked and reduced or prevented. As a result, a resin substrate that is resistant to peeling while preventing the flow of a joining material is provided.

Furthermore, in the present preferred embodiment, when conductor vias (not shown) other than conductor vias 6a and 6b are included in the resin substrate, in the step of connecting these other conductor vias to conductor pattern 7 by heating and pressurization, connections may also be established between conductor via 6a and first external electrode 9a, and between conductor via 6b and second external electrode 9b. Consequently, the manufacturing process is simplified.

In the present preferred embodiment, as showed in FIG. 9, it is preferable that the component-mounted resin substrate is defined by stacking one or more (two in the present preferred embodiment) third resin sheets 23 each made of the same material as first resin sheet 21; the component-mounted resin substrate includes an outer peripheral portion 2 surrounding component 3i when seen in a plan view; cavity 11 is defined by base portion 1 and outer peripheral portion 2 (see FIG. 8); and component 3i is disposed inside cavity 11 (see FIG. 9). With this configuration, a resin substrate including component 3i embedded therein is also resistant to peeling while preventing the flow of a joining material.

As illustrated in the present preferred embodiment, it is preferable that the component-mounted resin substrate includes a cover portion 4 that is joined to the upper side of base portion 1 so as to cover component 3i from above. With this configuration, component 3i is able to be covered from above and, thus, protected. Also, component 3i is able to be readily embedded. Thus, cavity is provided in the resin substrate, component 3i is placed inside cavity 11, and outer peripheral portion 2 and cover portion are as appropriate stacked thereon, and then, heated and pressurized, with the result that a component-mounted resin substrate that is resistant to peeling while preventing the flow of a joining material is provided.

Figure 10:
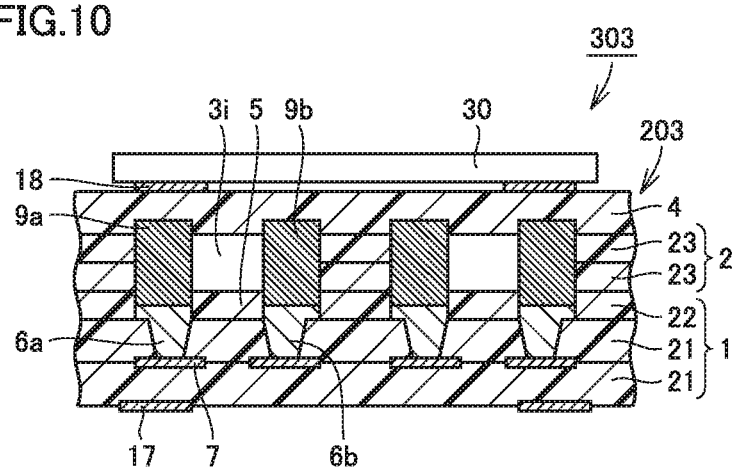
FIG. 10 is a cross-sectional view of another component-mounted resin substrate in the fourth preferred embodiment according to the present invention.

While FIG. 9 shows component-mounted resin substrate 203 including component 3i embedded therein as an example, a component 30 may be surface-mounted on the upper surface as shown in FIG. 10. Component 30 is surface-mounted through an external electrode provided on the upper surface of component-mounted resin substrate 203. Component 30 is preferably a radio frequency integrated circuit (RFIC), for example. FIG. 10 shows a component-mounted resin substrate 303 including component 3i embedded therein and component 30 surface-mounted thereon.

FIGS. 7 to 10 each show the state in which two components 3i are embedded inside the resin substrate, which is however merely by way of example. The number of components 3i embedded in the resin substrate may be one, or may be three or more, for example.

The number of stacked first resin sheets 21 included in base portion 1 is not limited to two or more, but may be only one, for example. In the description of the present preferred embodiment, second resin sheet 22 is disposed on the surface of base portion 1, but second resin sheet 22 may be disposed inside base portion 1.

Fifth Preferred Embodiment

Figure 11:
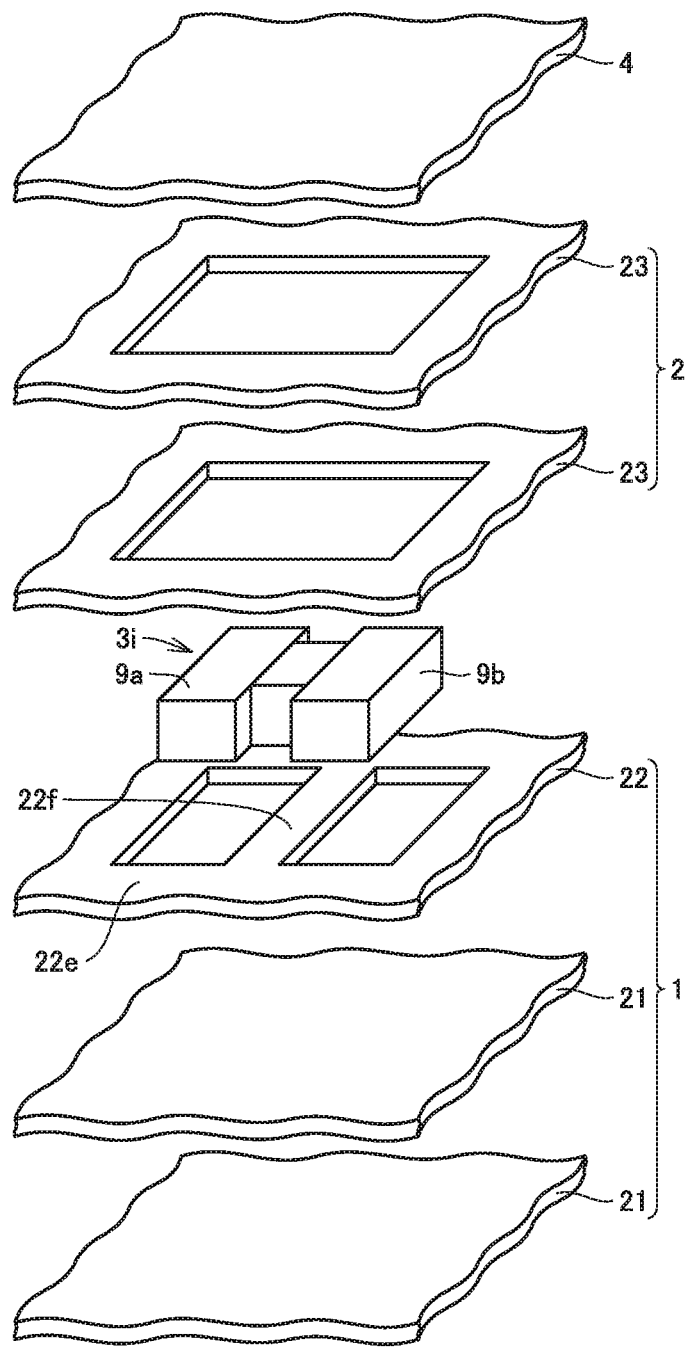
FIG. 11 is a perspective exploded view of a component-mounted resin substrate in a fifth preferred embodiment according to the present invention.

Referring to FIG. 11, a component-mounted resin substrate in a fifth preferred embodiment according to the present invention will be hereinafter described.

FIG. 11 shows a perspective exploded view of a component-mounted resin substrate in the present preferred embodiment. FIG. 11 does not show a conductor via and a conductor pattern inside the stacked body. Second resin sheet 22 includes a frame-shaped portion 22e and a bridge portion 22f that is structured and functions as a convex portion. Bridge portion 22*f* is supported by frame-shaped portion 22*e*. Bridge portion 22*f* is disposed so as to cross component 3*i*. Component 3*i* is disposed on second resin sheet 22, in which bridge portion 22*f* is located between first external electrode 9*a* and second external electrode 9*b* when seen in a plan view.

Component 3*i* includes a concave portion located between first external electrode 9*a* and second external electrode 9*b* so as to be concave as compared to first external electrode 9*a* and second external electrode 9*b*. At least a portion of convex portion 5 enters the concave portion. As described above, the concave portion is structured in such a manner that a region including no external electrode is concave due to the thickness of the applied external electrode material.

In the present preferred embodiment, by applying this configuration to the second resin sheet, bridge portion 22*f* structured and functioning as a convex portion is able to be stably supported. The cavity in which component 3*i* is received is defined by frame-shaped portion 22*e*, which prevents deviation of the relative position of bridge portion 22*f* that is to define convex portion 5. Consequently, highly precise assembly is able to be implemented.

In addition, the portion "concave as compared to first external electrode 9*a* and second external electrode 9*b*" in component 3*i* is not limited to a portion that is concave when seen in a plan view, but may be a portion that is concave when seen in a side view.

Sixth Preferred Embodiment

Figure 12:
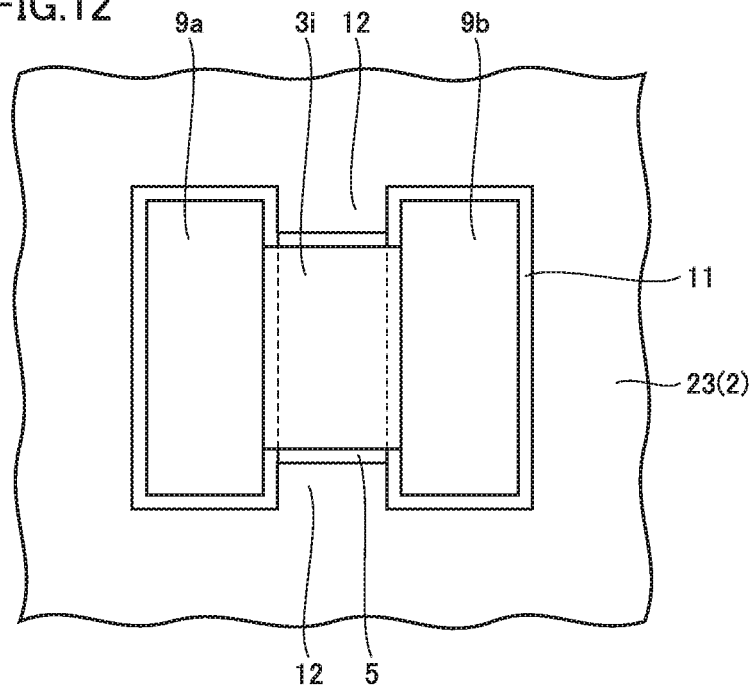
FIG. 12 is a plan view showing the positional relationship between an outer peripheral portion and a component included in a component-mounted resin substrate in a sixth preferred embodiment according to the present invention.

Referring to FIG. 12, a component-mounted resin substrate in a sixth preferred embodiment according to the present invention will be hereinafter described. The basic configuration of the component-mounted resin substrate in the present preferred embodiment is the same as or similar to that described in the fourth preferred embodiment (see FIGS. 7 to 9), but is different from the fourth preferred embodiment in the following points.

FIG. 12 shows a plan view of an outer peripheral portion 2 and a component 3*i* that are included in the component-mounted resin substrate in the present preferred embodiment. When seen in a plan view, component 3*i* is disposed inside cavity 11 surrounded by outer peripheral portion 2. Outer peripheral portion 2 is defined by disposing one third resin sheet 23 on base portion 1, or by stacking two or more third resin sheets 23 on base portion 1. Cavity 11 inside of which component 3*i* is disposed is not a simple rectangle when seen in a plan view, but includes a protruding portion 12 that protrudes inward.

In the example shown in FIG. 12, at least a portion of third resin sheet 23 included in outer peripheral portion 2 preferably protrudes into cavity 11 so as to enter between first external electrode 9*a* and second external electrode 9*b* of component 3*i*. Third resin sheet 23 partially protrudes, which defines protruding portion 12. Convex portion 5 is located at a position farther than third resin sheet 23 from the viewer of the figure. Convex portion 5 has the same or substantially the same width as that of protruding portion 12, and extends in a bridge shape in parallel or substantially parallel with protruding portion 12. FIG. 12 shows only a portion of convex portion 5.

In the present preferred embodiment, protruding portion 12 enters between first external electrode 9*a* and second external electrode 9*b* of component 3, so that the posture of component 3 is stabilized.

Seventh Preferred Embodiment

Referring to FIGS. 13 to 18, a component-mounted resin substrate in a seventh preferred embodiment according to the present invention will be hereinafter described. The basic configuration of the component-mounted resin substrate in the present preferred embodiment is the same as or similar to that described in the fourth preferred embodiment, but is different from the fourth preferred embodiment in the following points.

Figure 13:
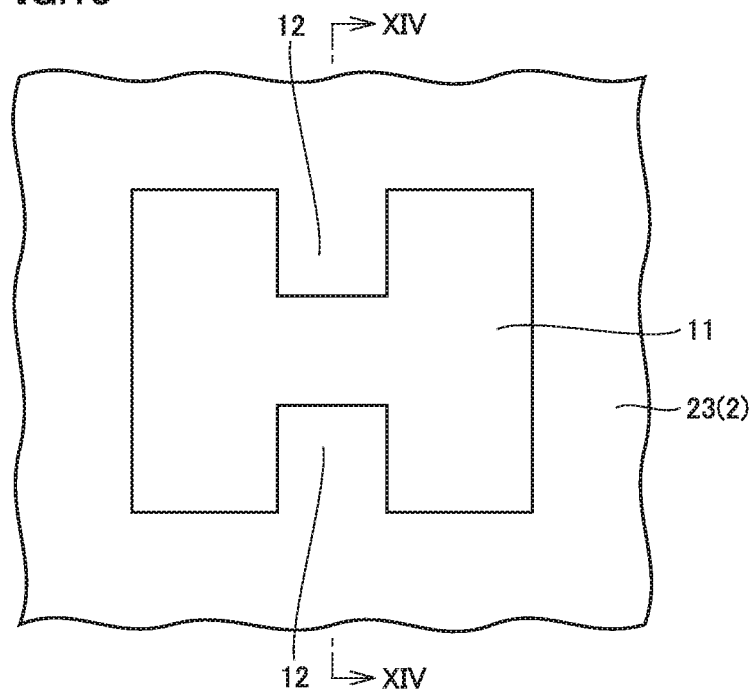
FIG. 13 is a plan view of an outer peripheral portion included in a component-mounted resin substrate in a seventh preferred embodiment according to the present invention.
Figure 14:
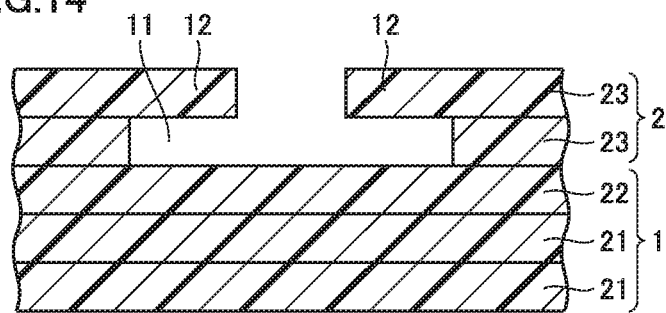
FIG. 14 is a cross-sectional view taken along an arrow line XIV-XIV in FIG. 13.

FIG. 13 shows a plan view of an outer peripheral portion 2 before a component 3*i* is disposed. FIG. 13 shows a cavity 11 in which component 3*i* is to be received. A portion of third resin sheet 23 protrudes as a protruding portion 12 into cavity 11. In a portion where protruding portions 12 face each other, the gap provided between the ends of protruding portions 12 is narrower than the width of the intermediate portion of component 3*i*. FIG. 14 shows a cross-sectional view taken along an arrow line XIV-XIV in FIG. 13. Protruding portion 12 is not provided in all of third resin sheets 23 defining an outer peripheral portion 2. Protruding portion 12 is provided only in third resin sheet 23 located as an upper layer in outer peripheral portion 2.

Figure 15:
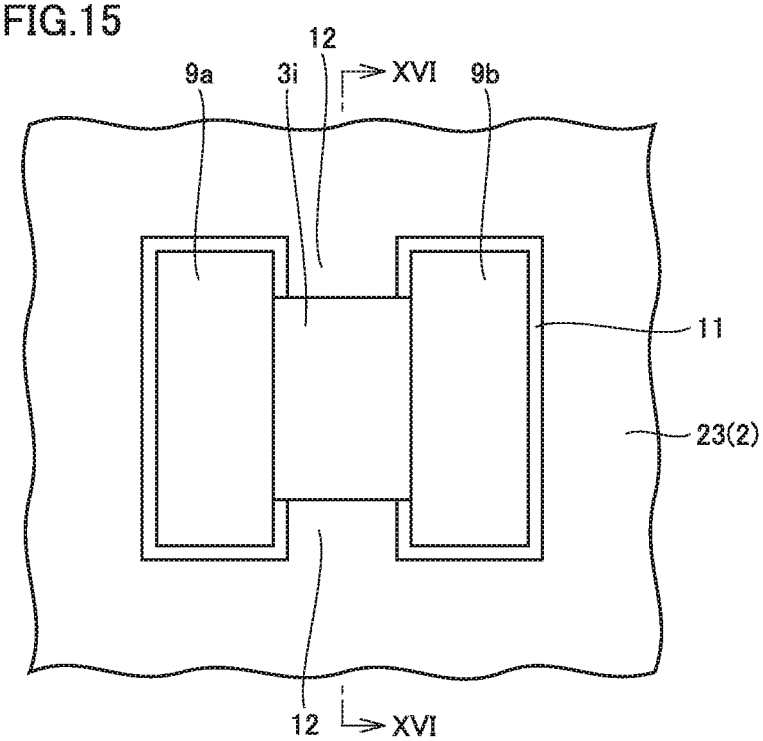
FIG. 15 is a plan view showing the positional relationship between an outer peripheral portion and a component included in the component-mounted resin substrate in the seventh preferred embodiment according to the present invention.
Figure 16:
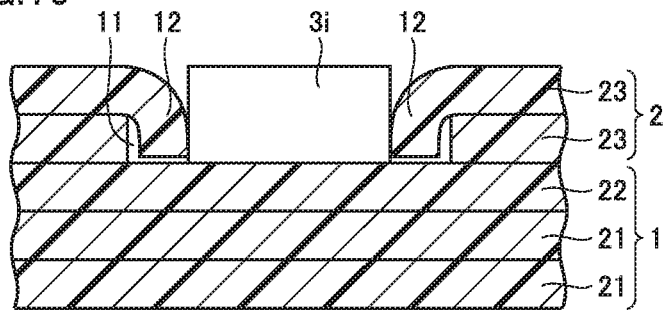
FIG. 16 is a cross-sectional view taken along an arrow line XVI-XVI in FIG. 15.
Figure 17:
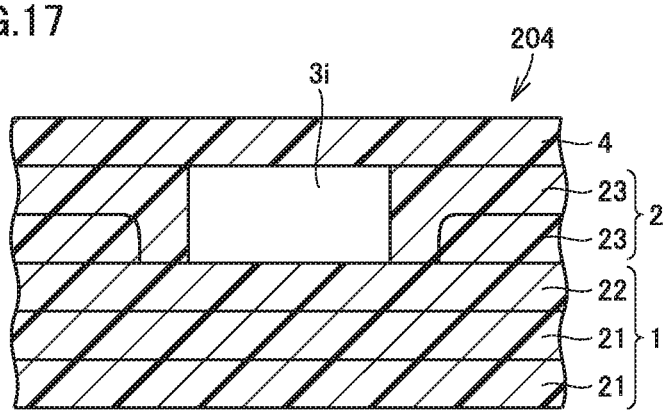
FIG. 17 is a cross-sectional view of the component-mounted resin substrate in the seventh preferred embodiment according to the present invention.
Figure 18:
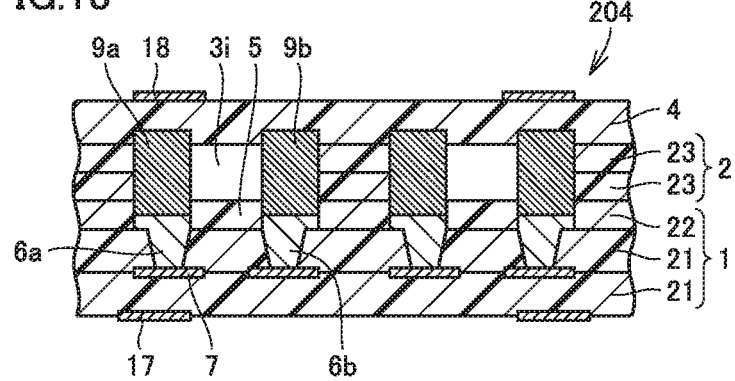
FIG. 18 is a cross-sectional view of the component-mounted resin substrate in the seventh preferred embodiment according to the present invention, which is seen from a different direction.

FIG. 15 is a plan view showing the state in which component 3*i* is disposed on outer peripheral portion 2 as described above. FIG. 16 shows a cross-sectional view taken along an arrow line XVI-XVI in FIG. 15. Protruding portion 12 is pressed by component 3*i* and bent downward. Furthermore, FIG. 17 is a cross-sectional view showing the state after cover portion 4 is stacked, which is then thermocompression-bonded. In this manner, a component-mounted resin substrate 204 is obtained. FIG. 17 does not show conductor via 6, conductor pattern 7, external electrodes 17 and 18, and other features. While FIG. 17 does not show convex portion 5, FIG. 18 shows a cross-sectional view of this convex portion 5 as seen from a different direction by 90°. Convex portion 5 is located below component 3*i*, and blocks the joining material.

In the present preferred embodiment, at least a portion of third resin sheet 23 included in outer peripheral portion 2 protrudes into cavity 11, and bends toward base portion 1 while contacting component 3*i*.

In the present preferred embodiment, component 3*i* is disposed inside cavity 11 such that protruding portion 12 provided in outer peripheral portion 2 is bent toward base portion 1. Protruding portion 12 bent in this manner is housed in the gap between the inner wall of cavity 11 and component 3*i*, so that component 3*i* is positioned stably inside cavity 11. Through thermocompression-bonding, the gap between the inner wall of cavity 11 and component 3*i* is filled with the bent protruding portion 12, so that the structure holding component 3*i* with almost no gap is produced.

Eighth Preferred Embodiment

Figure 19:
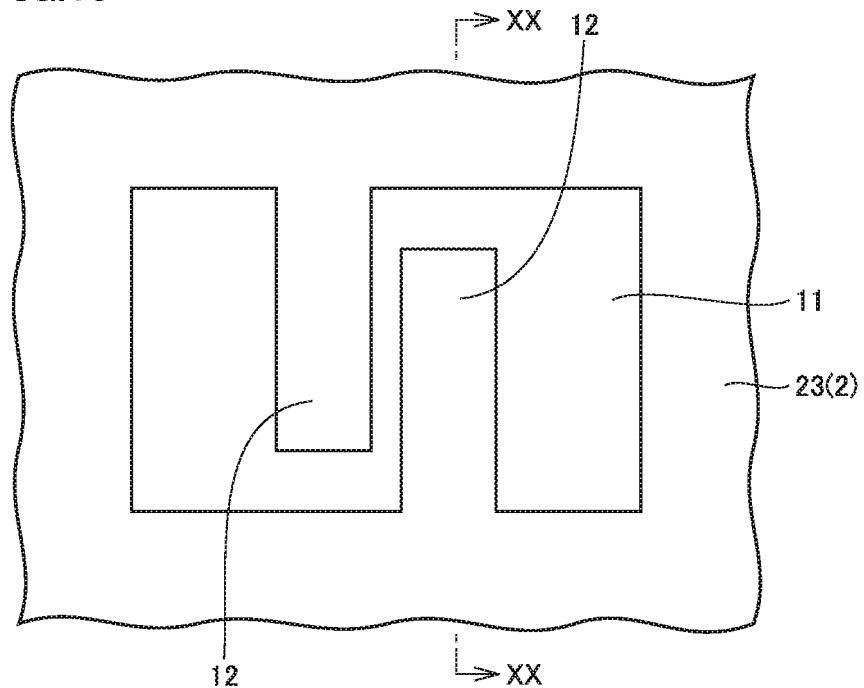
FIG. 19 is a plan view of an outer peripheral portion included in a component-mounted resin substrate in an eighth preferred embodiment according to the present invention.
Figure 20:
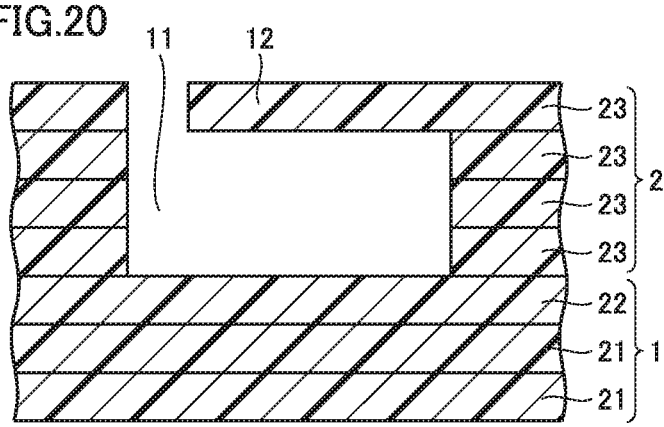
FIG. 20 is a cross-sectional view taken along an arrow line XX-XX in FIG. 19.

Referring to FIGS. 19 to 21, a component-mounted resin substrate in an eighth preferred embodiment according to the present invention will be hereinafter described. The basic configuration of the component-mounted resin substrate in the present preferred embodiment is the same as or similar to that described in the seventh preferred embodiment, but is different from the seventh preferred embodiment in the following points.

FIG. 19 shows a plan view of outer peripheral portion 2 before component 3*i* is disposed. FIG. 19 shows cavity 11 in which component 3*i* is to be received. A portion of third resin sheet 23 protrudes as a protruding portion 12 into cavity 11. FIG. 20 shows a cross-sectional view taken along an arrow line XX-XX in FIG. 19. In the present preferred embodiment, cavity 11 is deep, and according to the depth of cavity 11, protruding portion 12 is longer than that shown in the seventh preferred embodiment. In the present preferred embodiment, since protruding portions 12 are too long to face each other inside cavity 11, protruding portions 12 are located so as to be displaced from the positions at which protruding portions 12 face each other, as shown in FIG. 19.

FIG. 21 is a cross-sectional view showing the state in which component 3*i* is disposed on outer peripheral portion 2 as described above. Long protruding portion 12 is pressed by component 3*i* and bent so as to reach the vicinity of the bottom surface of cavity 11.

Also in the present preferred embodiment, at least a portion of third resin sheet 23 included in outer peripheral portion 2 protrudes into cavity 11, and bends toward base portion 1 while contacting component 3*i*.

The present preferred embodiment also achieves the same or similar effects as those in the seventh preferred embodiment. Particularly when cavity 11 is deep, it is preferable that protruding portion 12 extending from third resin sheet 23 into cavity 11 is increased in length. Accordingly, it is effective to provide the configuration as shown in the present preferred embodiment.

Ninth Preferred Embodiment

Referring to FIG. 22, a component-mounted resin substrate in a ninth preferred embodiment according to the present invention will be hereinafter described.

FIG. 22 is a plan view showing the state in which two components 31 and 32 are provided on second resin sheet 22. In the present preferred embodiment, one bridge portion 22*fi* is provided so as to cross the center of the cavity. These two components 31 and 32 are arranged so as to extend over one common bridge portion 22*fi*. Bridge portion 22*fi* defines a convex portion 5. Component 31 includes a lower surface on which a first external electrode 9*a*1 and a second external electrode 9*b*1 are provided. Component 32 includes a lower surface on which a first external electrode 9*a*2 and a second external electrode 9*b*2 are provided. The first connecting conductor and the second connecting conductor are located below first external electrode 9*a*1 and second external electrode 9*b*1 of component 31. Aside from these components, the first connecting conductor and the second connecting conductor are also located below first external electrode 9*a*2 and second external electrode 9*b*2 of component 32. First and second connecting conductors are hidden behind components 31 and 32, and therefore, not shown in FIG. 22.

In this case, the number of components extending over one bridge portion 22*fi* is preferably two, but may be one, or may be three or more, for example.

The present preferred embodiment also achieves the same or similar effects as those described in the first preferred embodiment. In the present preferred embodiment, a plurality of components are able to be disposed using one bridge portion 22*fi* as convex portion 5.

Tenth Preferred Embodiment

Figure 23:
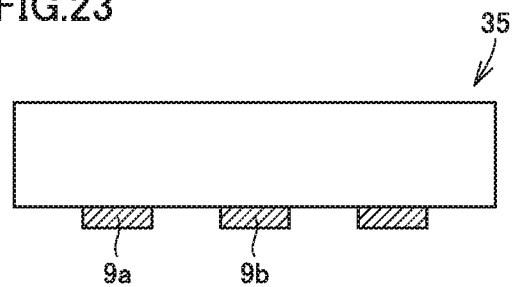
FIG. 23 is a side view of a component included in a component-mounted resin substrate in a tenth preferred embodiment according to the present invention.
Figure 24:
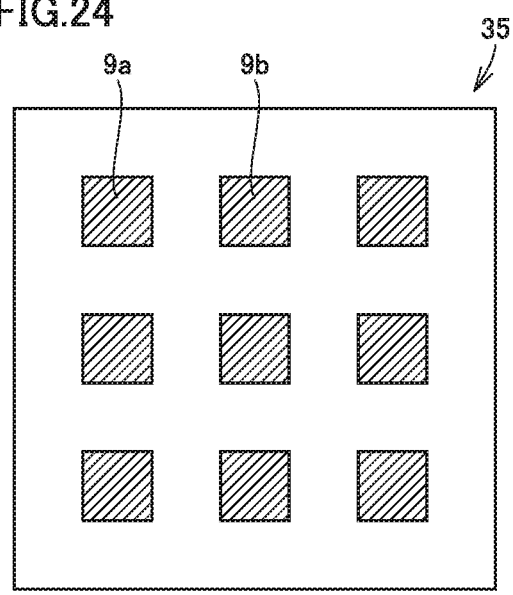
FIG. 24 is a bottom view of the component included in the component-mounted resin substrate in the tenth preferred embodiment according to the present invention.
Figure 25:
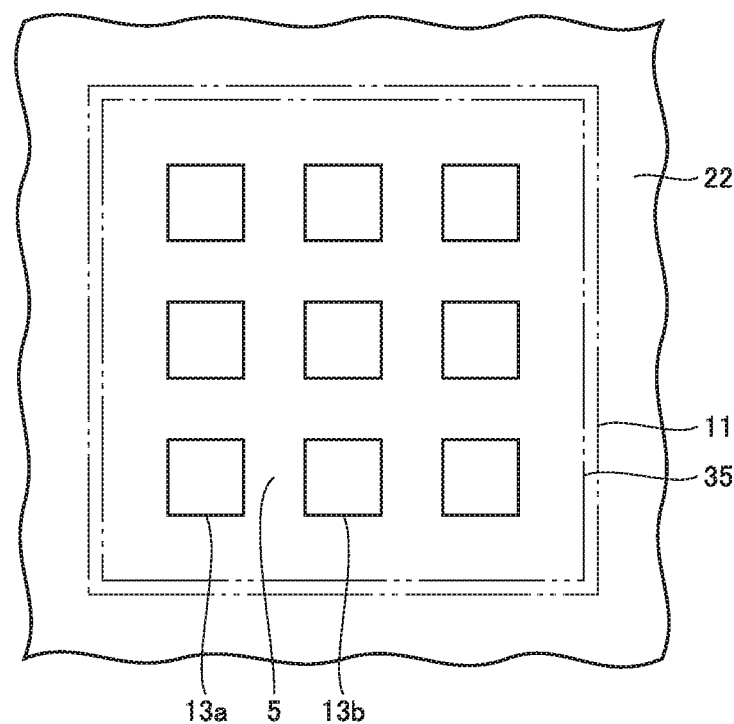
FIG. 25 is a plan view of a second resin sheet included in the component-mounted resin substrate in the tenth preferred embodiment according to the present invention.

Referring to FIGS. 23 to 25, a component-mounted resin substrate in a tenth preferred embodiment according to the present invention will be hereinafter described. The basic configuration of the component-mounted resin substrate in the present preferred embodiment is the same as or similar to that described in the fourth preferred embodiment (see FIGS. 7 to 9), but is different from the fourth preferred embodiment in the following points.

In the component-mounted resin substrate in the present preferred embodiment, a component 35 is embedded in cavity 11. Component 35 includes a lower surface on which a first external electrode 9*a* and a second external electrode 9*b* are provided, as shown in FIG. 23. FIG. 24 shows a bottom view of component 35. A total of nine (3×3) external electrodes are disposed on the lower surface of component 35. These external electrodes each preferably have an approximately square shape, for example. First external electrode 9*a* and second external electrode 9*b* are two adjacent external electrodes that are arbitrarily selected from among nine external electrodes disposed on the lower surface of component 35.

FIG. 25 shows a plan view of second resin sheet 22 applied below component 35 when component 35 is mounted. Second resin sheet 22 is provided with a total of nine (3×3) openings. Cavity 11 is disposed at a position closer to the viewer of the figure than second resin sheet 22. The position of this cavity 11 is shown by a two-dot chain line in FIG. 25. The outline of component 35 disposed inside cavity 11 is also shown by a two-dot chain line. Two adjoining openings 13*a* and 13*b* of the plurality of openings provided in second resin sheet 22 accommodate first external electrode 9*a* and second external electrode 9*b*. First external electrode 9*a* is received in opening 13*a* and second external electrode 9*b* is received in opening 13*b*. In this case, a bridge-shaped portion included in second resin sheet 22 and separating openings 13*a* and 13*b* from each other defines a convex portion 5.

The present preferred embodiment also achieves the same or similar effects as those described in the first preferred embodiment. When a large number of external electrodes are arranged in a matrix configuration on the lower surface of the component, and each of these external electrodes is connected to a corresponding one of a plurality of connecting conductors provided in the base portion, it is effective to use a lattice-shaped second resin sheet 22 as illustrated in the present preferred embodiment. In this case, focusing attention on first external electrode 9*a* and second external electrode 9*b* as representative examples of the plurality of external electrodes, the description of the features related to these first external electrode 9*a* and second external electrode 9*b* have been provided in the above, but the description of the features related to any other external electrodes will be the same. Also in this case, it is assumed that the external electrode has an approximately square shape and the total number of external electrodes is nine (3×3), which are however merely by way of example, and the shape of each external electrode, and the number and the arrangement of external electrodes are not limited thereto.

Eleventh Preferred Embodiment

Figure 26:
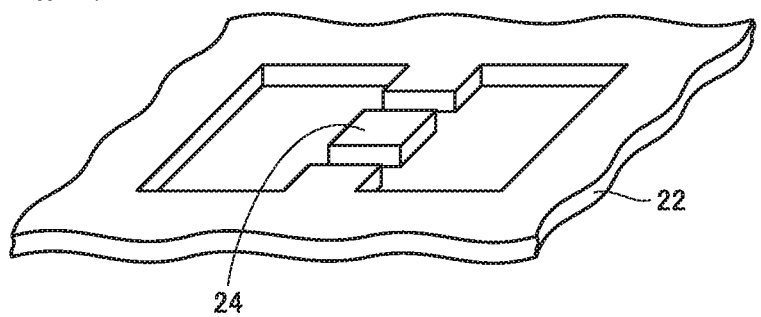
FIG. 26 is a perspective view of a second resin sheet included in a component-mounted resin substrate in an eleventh preferred embodiment according to the present invention.
Figure 27:
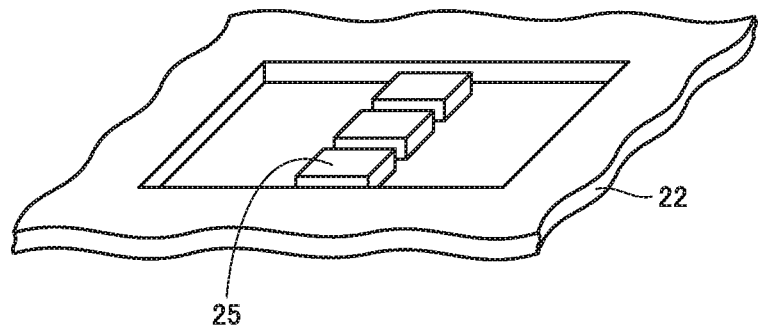
FIG. 27 is a perspective view of a modification of the second resin sheet included in the component-mounted resin substrate in the eleventh preferred embodiment according to the present invention.

Referring to FIGS. 26 and 27, a component-mounted resin substrate in an eleventh preferred embodiment according to the present invention will be hereinafter described. The basic configuration of the component-mounted resin substrate in the present preferred embodiment is the same as or similar to that described in the fourth preferred embodiment (see FIGS. 7 to 9), but is different from the fourth preferred embodiment in the following points.

In the component-mounted resin substrate in the present preferred embodiment, a component is embedded inside a cavity and second resin sheet 22 located below the component has a shape as shown in FIG. 26. In this second resin sheet 22, a portion 24 that is to define convex portion 5 is not continuously provided as a bridge portion, but is preferably discontinuous at a halfway point. Second resin sheet 22 may also be structured in this manner.

Also in the component-mounted resin substrate of the present preferred embodiment, a resin substrate that is resistant to peeling while preventing the flow of a joining material is provided.

For example, second resin sheet 22 shown in FIG. 27 may be used in place of second resin sheet 22 shown in FIG. 26. In the example shown in FIG. 27, second resin sheet 22 includes a portion 25 that is to define convex portion 5. The specific shape of second resin sheet 22 may be designed as appropriate in each case.

When second resin sheet 22 is discontinuous at a halfway point and includes a separated portion as shown in FIGS. 26 and 27, a transfer sheet may be used to prevent the positional displacement of each component during assembly, to enable efficient and highly precise assembly to be achieved.

Twelfth Preferred Embodiment

Figure 28:
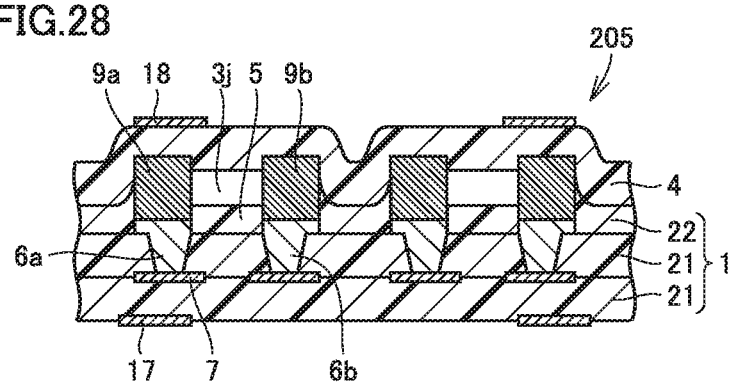
FIG. 28 is a cross-sectional view of a component-mounted resin substrate in a twelfth preferred embodiment according to the present invention.

Referring to FIG. 28, a component-mounted resin substrate in a twelfth preferred embodiment according to the present invention will be hereinafter described. While the component-mounted resin substrate including outer peripheral portion 2 has been described in the fourth preferred embodiment, a component-mounted resin substrate 205 in the present preferred embodiment preferably does not include outer peripheral portion 2. Component-mounted resin substrate 205 includes a component 3j. In component-mounted resin substrate 205, a cover portion 4 is disposed directly over the upper side of base portion 1. Cover portion 4 deforms so as to conform to the shape of component 3j, such that concavities and convexities are provided on the upper surface of cover portion 4.

The present preferred embodiment also achieves the same or similar effects as those described in the first preferred embodiment. Since an outer peripheral portion is not provided and cover portion 4 is disposed directly over the upper side of the base portion, the entire thickness is able to be reduced. When concavities and convexities are able to be provided on the upper surface of cover portion 4, it is preferable to utilize the configuration of component-mounted resin substrate 205 in the present preferred embodiment.

Thirteenth Preferred Embodiment

Figure 29:
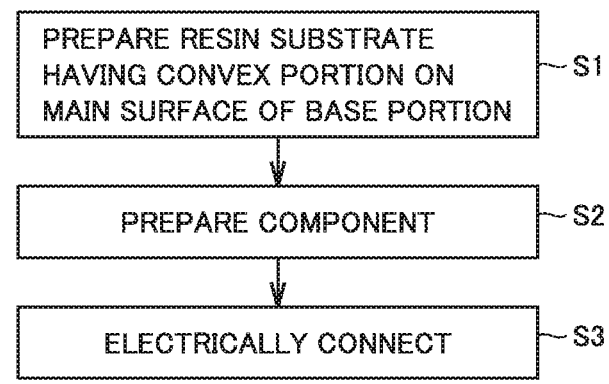
FIG. 29 is a flowchart illustrating a method of manufacturing a component-mounted resin substrate in a thirteenth preferred embodiment according to the present invention.

Referring to FIG. 29, a method of manufacturing a component-mounted resin substrate in a thirteenth preferred embodiment according to the present invention will be hereinafter described. FIG. 29 shows a flowchart illustrating the method of manufacturing a component-mounted resin substrate in the present preferred embodiment.

The method of manufacturing a component-mounted resin substrate includes step S1 of preparing a resin substrate, the resin substrate including a base portion formed by one first resin sheet made of a thermoplastic resin as a main material or formed by a stack of two or more first resin sheets each made of a thermoplastic resin as a main material, the base portion including a main surface, the resin substrate including a first connecting conductor and a second connecting conductor that are formed on the main surface of the base portion so as to be spaced away from each other. The base portion includes a convex portion separating the first connecting conductor and the second connecting conductor from each other on the main surface by a second resin sheet disposed at a position on a surface of the base portion or inside the base portion. A material of the second resin sheet is the same as a material of the first resin sheet. The method further includes step S2 of preparing a component including a first external electrode and a second external electrode; and step S3 of disposing the component on an upper surface of the base portion such that the convex portion contacts a region between the first external electrode and the second external electrode of the component, and electrically connecting the first connecting conductor and the second connecting conductor to the first external electrode and the second external electrode, respectively.

In step S1, for example, a resin substrate as shown in FIG. 2 or 5 is prepared. In step S2, for example, a component 3 as shown in FIG. 2 is prepared. In step S3, connection as shown in FIGS. 2 and 3 is established.

According to the present preferred embodiment, a component-mounted resin substrate that is resistant to peeling while preventing the flow of a joining material is provided.

Fourteenth Preferred Embodiment

Figure 30:
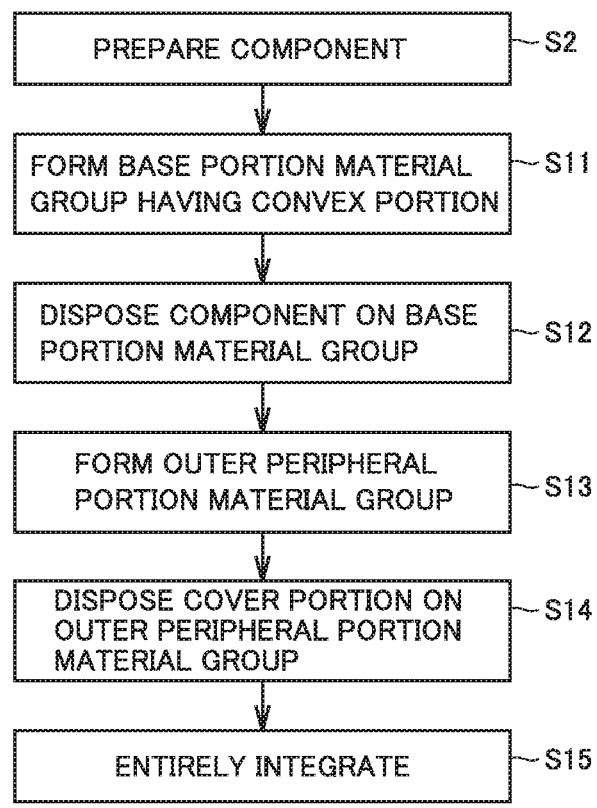
FIG. 30 is a flowchart illustrating a method of manufacturing a component-mounted resin substrate in a fourteenth preferred embodiment according to the present invention.

Referring to FIG. 30, a method of manufacturing a component-mounted resin substrate in a fourteenth preferred embodiment according to the present invention will be hereinafter described. FIG. 30 is a flowchart illustrating the method of manufacturing a component-mounted resin substrate in the present preferred embodiment.

The method of manufacturing a component-mounted resin substrate in the present preferred embodiment includes step S2 of preparing a component including a first external electrode and a second external electrode; step S11 of forming a base portion material group, the base portion material group including, on an upper surface, a first connecting conductor and a second connecting conductor that are disposed so as to be spaced away from each other, and including a convex portion separating the first connecting conductor and the second connecting conductor from each other, by disposing one first resin sheet made of a thermoplastic resin as a main material or by disposing a stack of two or more first resin sheets each made of a thermoplastic resin as a main material, and by disposing a second resin sheet at a position on a surface of the base portion material group or inside the base portion material group, a material of the second resin sheet being the same as a material of the first resin sheet. The method further includes step S12 of disposing the component on the base portion material group such that the first external electrode and the second external electrode contact the first connecting conductor and the second connecting conductor, respectively; step S13 of forming an outer peripheral portion material group by disposing one or more third resin sheets on the base portion material group so as to surround the component when seen in a plan view, a material of each of the one or more third resin sheets being the same as the material of the first resin sheet; step S14 of disposing a cover portion covering the component on the outer peripheral portion material group; and step S15 of collectively heating and pressurizing a combination of the base portion material group, the component, the outer peripheral portion material group, and the cover portion so as to be entirely integrated.

In step S2, for example, a component 3 as shown in FIG. 2 or 7 is prepared. In step S11, for example, a material group shown as a base portion 1 in FIG. 7 or 11 is prepared. In step S12, for example, component 3 is disposed on second resin sheet 22, as shown in FIG. 7 or 11. In step S13, third resin sheets 23 are stacked to obtain an outer peripheral portion material group, for example, as shown in FIG. 7 or 11. In step S14, cover portion 4 is placed over the upper side of the outer peripheral portion material group, for example, as shown in FIG. 7. In step S15, by applying heat and pressure, layers shown in FIG. 7 are collectively thermocompression-bonded so as to be integrated.

As to step S12 and step S13, the flowchart in FIG. 30 illustrates that step S12 is performed first, and then, step S13 is performed, but the sequential order of step S12 and step S13 is actually not limited thereto. For example, step S13 may be performed first, and then, step S12 may be performed. Step S12 and step S13 may be simultaneously performed. For example, as illustrated with reference to FIGS. 13 to 18 in the seventh preferred embodiment, when protruding portion 12 is pressed and bent by component 3i in the state where protruding portion 12 is provided in advance in third resin sheet 23, as a matter of course, step S13 is performed first, and then, step S12 is to be performed.

By affixing a component onto the lower surface of the resin sheet defining cover portion 4 in advance, step 12 and step S14 may be simultaneously performed. In this case, step S12 and step S14 may be simultaneously performed after step S13.

According to the present preferred embodiment, a component-mounted resin substrate that is resistant to peeling while preventing the flow of a joining material is provided.

In addition, at least a portion of the third resin sheet included in a portion to be used as the outer peripheral portion may preferably include a protruding portion extending inward when seen in a plan view. In at least one of step S12 of disposing the component on the base portion material group and step S13 of forming an outer peripheral portion material group, it is preferable that the protruding portion enters between the first external electrode and the second external electrode of the component. In other words, it is preferable that component 3i and protruding portion 12 are combined in the positional relationship, for example, as shown in FIG. 12. In this case, the effect as described in the sixth preferred embodiment is achieved.

In addition, at least a portion of the third resin sheet included in a portion to be used as the outer peripheral portion preferably includes a protruding portion extending inward when seen in a plan view. In step S12 of disposing the component on the base portion material group, it is preferable that the component is disposed in a state where the protruding portion is pressed by the component so as to bend the protruding portion toward the base portion material group. In other words, it is preferable that component 3i and protruding portion 12 are combined in the positional relationship, for example, as shown in FIGS. 13 to 17. In this case, the effect as described in the seventh preferred embodiment is achieved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A resin substrate comprising:
    a base portion including one first resin sheet made of a thermoplastic resin as a main material or a stack of two or more first resin sheets each made of a thermoplastic resin as a main material, the base portion including a main surface; and
    a first connecting conductor and a second connecting conductor that are provided on the main surface of the base portion so as to be spaced away from each other; wherein
    a portion of each of the first connecting conductor and the second connecting conductor extends below the main surface on which the first connecting conductor and the second connecting conductor are provided;
    the base portion includes a convex portion separating the first connecting conductor and the second connecting conductor from each other on the main surface by a second resin sheet disposed at a position on a surface of the base portion or inside the base portion;
    a material of the second resin sheet is the same as a material of the first resin sheet;
    the convex portion includes a bridge portion and a frame-shaped portion that supports the bridge portion;
    the bridge portion of the convex portion formed by the second resin sheet is disposed so as to entirely or substantially entirely cross and cover a region of the main surface that extends from the first connecting conductor to the second connecting conductor when seen in a cross-sectional view; and
    no conductor is provided on the convex portion separating the first connecting conductor and the second connecting conductor.

2. The resin substrate according to claim 1, wherein the second resin sheet includes an end that is covered by the first resin sheet on the main surface of the base portion.

3. The resin substrate according to claim 1, wherein each of the first connecting conductor and the second connecting conductor is a conductor via.

4. The resin substrate according to claim 1, wherein each of the first connecting conductor and the second connecting conductor includes solder.

5. A component-mounted resin substrate comprising:
    the resin substrate according to claim 1; and
    a component including a first external electrode and a second external electrode, the component being disposed on an upper surface of the base portion so as to extend over the bridge portion of the convex portion, the frame-shaped portion surrounding the component when seen in a plan view, and the first connecting conductor and the second connecting conductor being electrically connected to the first external electrode and the second external electrode, respectively.

6. The component-mounted resin substrate according to claim 5, wherein
    the component includes a concave portion provided between the first external electrode and the second external electrode, the concave portion is concave as compared to the first external electrode and the second external electrode, and at least a portion of the convex portion is located in the concave portion.

7. The component-mounted resin substrate according to claim 5, further comprising a cover portion joined to an upper side of the base portion and covering the component from above.

8. The component-mounted resin substrate according to claim 5, further comprising:
    an outer peripheral portion defined by a stack of one or more third resin sheets each made of a material that is the same as the material of the first resin sheet, the outer peripheral portion surrounding the component when seen in a plan view; wherein
    a cavity is defined by the base portion and the outer peripheral portion; and
    the component is disposed inside the cavity.

9. The component-mounted resin substrate according to claim 8, wherein at least a portion of a third resin sheet of the one or more third resin sheets included in the outer peripheral portion protrudes into the cavity so as to extend between the first external electrode and the second external electrode of the component.

10. The component-mounted resin substrate according to claim 8, wherein at least a portion of a third resin sheet of the one or more third resin sheets included in the outer peripheral portion protrudes into the cavity, and bends toward the base portion while contacting the component.

11. The component-mounted resin substrate according to claim 5, wherein the second resin sheet includes an end that is covered by the first resin sheet on the main surface of the base portion.

12. The component-mounted resin substrate according to claim 5, wherein each of the first connecting conductor and the second connecting conductor includes solder.

13. The component-mounted resin substrate according to claim 5, wherein each of the first connecting conductor and the second connecting conductor is a conductor via.

14. A method of manufacturing a component-mounted resin substrate, the method comprising:
preparing a resin substrate, the resin substrate including a base portion formed by one first resin sheet made of a thermoplastic resin as a main material or formed by a stack of two or more first resin sheets each made of a thermoplastic resin as a main material, the base portion including a main surface, the resin substrate including a first connecting conductor and a second connecting conductor that are formed on the main surface of the base portion so as to be spaced away from each other, the base portion including a convex portion separating the first connecting conductor and the second connecting conductor from each other on the main surface by a second resin sheet disposed at a position on a surface of the base portion or inside the base portion, a material of the second resin sheet being the same as a material of the first resin sheet;
preparing a component including a first external electrode and a second external electrode; and
disposing the component on an upper surface of the base portion such that the convex portion contacts a region between the first external electrode and the second external electrode of the component, and electrically connecting the first connecting conductor and the second connecting conductor to the first external electrode and the second external electrode, respectively; wherein
a portion of each of the first connecting conductor and the second connecting conductor extends below the main surface on which the first connecting conductor and the second connecting conductor are provided;
the convex portion includes a bridge portion and a frame-shaped portion that supports the bridge portion;
the bridge portion of the convex portion formed by the second resin sheet is disposed so as to entirely or substantially entirely cross and cover a region of the main surface that extends from the first connecting conductor to the second connecting conductor when seen in a cross-sectional view; and
no conductor is formed on the convex portion separating the first connecting conductor and the second connecting conductor.

15. The method of manufacturing a component-mounted resin substrate according to claim 14, wherein the second resin sheet includes an end that is covered by the first resin sheet on the main surface of the base portion.

16. The method of manufacturing a component-mounted resin substrate according to claim 14, wherein each of the first connecting conductor and the second connecting conductor is a conductor via.

17. The method of manufacturing a component-mounted resin substrate according to claim 14, wherein each of the first connecting conductor and the second connecting conductor includes solder.

* * * * *